(12) United States Patent
Lee

(10) Patent No.: US 6,448,183 B1
(45) Date of Patent: Sep. 10, 2002

(54) METHOD OF FORMING CONTACT PORTION OF SEMICONDUCTOR ELEMENT

(75) Inventor: Byung-Chul Lee, Bucheon (KR)

(73) Assignees: Anam Semiconductor Inc., Seoul (KR); Ankor Technology, Inc., Chandler, AZ (US)

(*) Notice: Subject to any disclaimer, the term of this patent is extended or adjusted under 35 U.S.C. 154(b) by 0 days.

(21) Appl. No.: 09/710,763

(22) Filed: Nov. 11, 2000

(30) Foreign Application Priority Data

Nov. 11, 1999 (KR) .......................................... 99-50041

(51) Int. Cl.[7] .......................................... H01L 21/4763
(52) U.S. Cl. ........................ 438/701; 438/978; 438/640; 430/312; 430/349; 430/394; 430/494
(58) Field of Search .................................. 438/640, 673, 438/701, 708, 713, 978, FOR 355; 430/312, 348, 349, 494, 394

(56) References Cited

U.S. PATENT DOCUMENTS 5,359,101 A * 10/1994 Woods et al. ................ 526/298
5,882,999 A * 3/1999 Anderson et al. ........... 438/629

FOREIGN PATENT DOCUMENTS

JP 62137831 A * 6/1987 ......... H01L/21/302

* cited by examiner

Primary Examiner—George Fourson
Assistant Examiner—Thanh Pham
(74) Attorney, Agent, or Firm—Skjerven Morrill LLP

(57) ABSTRACT

Disclosed is a method for forming a contact portion of a semiconductor element. An exemplary method includes the steps of depositing an insulation layer on a lower thin film on which there is formed a semiconductor element electrode or a metal wiring pattern, and then realizing an even upper surface of the insulation layer; forming a photosensitive film pattern thereon having a contact or via hole pattern in which inner walls of the contact holes or via holes smoothly curve downward to reach an upper surface of the insulation layer; dry-etching the insulation layer using a mask following the photosensitive film pattern to form contact holes or via holes; removing the photosensitive film pattern, then depositing a barrier metal and tungsten to fill the contact holes or the via holes; and performing a chemical mechanical polishing process to remove the barrier metal and the tungsten from the upper surface of the semiconductor element until the insulation layer is exposed and a flat surface is realized.

12 Claims, 4 Drawing Sheets

Negative PR (3-Layer)
$L_1 < L_2 < L_3,$ $C_p$: adhesion rate
$C_{p1} < C_{p2} < C_{p3}$ C PR coating → B PR coating → A PR coating

METHOD OF FORMING CONTACT PORTION OF SEMICONDUCTOR ELEMENT

BACKGROUND OF THE INVENTION (a) Field of the Invention

The present invention relates to a manufacturing process for a semiconductor element, and more particularly, to a method for forming a contact portion used in electrically connecting upper and lower conductive layers, which are electrically separated by an insulation layer.

(b) Description of the Related Art

In a semiconductor integrated circuit, there are formed, within an area limited according to the level of increased density, contact holes for connecting a metal wiring layer with a gate, source and drain formed on a semiconductor substrate, and via-holes for making connections between metal wiring layers.

In particular, in multi-layer wiring technology, since a space through which wires pass through between semiconductor elements is of no consequence, it is possible to minimize the size of the semiconductor chip. However, since the multi-layer wiring technology is applied by repeating a layer growing process, defects such as the disconnection of wires can result on a surface. Step coverage or contact defects resulting from an irregular surface at areas where wires cross are particularly problematic.

Further, after contact holes and via-holes are formed, and a metal barrier is deposited, when tungsten is adhered for covering the via-holes, problems such as voids being formed in the holes result.

Accordingly, in recent times, in the process of forming the contact holes and via-holes of the semiconductor element, in the case of adhering a barrier metal in the contact holes or via-holes in order to improve step coverage and prevent the formation of voids, an upper portion of the contact holes or via-holes are made slanted using a sputter etch process that employs argon gas. Subsequently, tungsten is used to cover the holes.

However, in such a method, argon sputter etching of an upper part of the contact holes does not form a smooth slant all the way to a lower portion of the contact holes. Accordingly, the step coverage problem can not be fully solved and an evenness of the semiconductor substrate is not realized. Further, the addition of the argon sputter etching process increases overall manufacturing costs.

SUMMARY OF THE INVENTION

The present invention has been made in an effort to solve the above problems.

It is an object of the present invention to provide a method for forming a contact portion used in electrically connecting upper and lower conductive layers in which, when forming contact holes for connecting a gate, source and drain with a metal wiring layer, and via-holes for making a connection between metal wiring layers, step coverage is effectively improved with no increase in manufacturing costs.

To achieve the above object and others, the present invention provides a method for forming a contact portion of a semiconductor element comprising the steps of: depositing an insulation layer on a lower thin film on which there is formed a semiconductor element electrode or a metal wiring pattern, and then providing a planar top surface of the insulation layer; forming a photosensitive film pattern having a contact or via hole pattern in which inner walls of the contact holes or via holes smoothly curve downward to reach an upper surface of the insulation layer; dry-etching the insulation layer using a mask following the photosensitive film pattern to form contact holes or via holes; removing the photosensitive film pattern, then depositing a barrier metal and tungsten to fill the contact holes or the via holes; and performing a chemical mechanical polishing process to remove the barrier metal and the tungsten from the upper surface of the semiconductor element until the insulation layer is exposed and a flat surface is realized.

According to a feature of the present invention, the step of forming the photosensitive film pattern having a contact or via hole pattern in which the inner walls of the contact holes or via holes smoothly curve downward comprises the steps of depositing a photosensitive film on an upper surface of the insulation layer and developing the photosensitive film through a light exposure process using a mask on which there is formed a contact hole or via-hole pattern, thereby forming a photosensitive film pattern in which inner walls of the photosensitive film pattern are stepped; and hard baking the photosensitive film pattern fabricated in a stepped formation such that the stepped formation is smoothed.

According to another feature of the present invention, in order to form the stepped pattern of the inner walls of the photosensitive film pattern, a temperature is sequentially or continuously varied during the depositing of the photosensitive film.

According to yet another feature of the present invention, the temperature is varied by altering a temperature of a sub-plate used to support a wafer.

According to still yet another feature of the present invention, the temperature is varied using a heater affixed to the outside of a nozzle, the nozzle being used for depositing the photosensitive film.

According to still yet another feature of the present invention, in order to form the stepped pattern of the inner walls of the photosensitive film pattern, a layered structure using photosensitive films of differing sensitivities is used during the depositing of the photosensitive film.

According to still yet another feature of the present invention, in order to form the stepped pattern of the inner walls of the photosensitive film pattern, an exposure energy is sequentially or continuously varied during the exposing of the photosensitive film.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION

Exemplary embodiments of the present invention will now be described in detail with reference to the accompanying drawings.

Figure 1A:
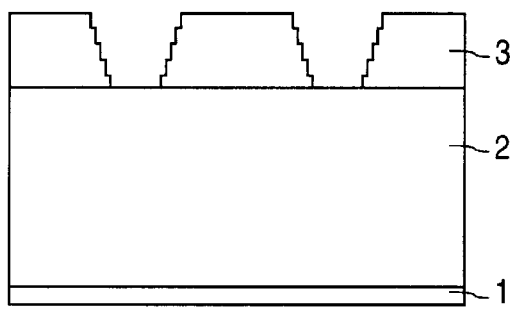
FIGS. 1a–1d are schematic views of sequential processes in a method for forming a contact portion of a semiconductor element.

FIGS. 1a–1d show sequential schematic views of sequential processes in a method for forming a contact portion of a semiconductor element. Referring to FIG. 1a, an insulation layer 2 is formed on a lower thin film 1 of either: (a) a semiconductor substrate on which there is formed a semiconductor element electrode of a semiconductor element including a gate, source and drain; or (b) a metal wiring layer on which is formed a metal thin film pattern for connecting a semiconductor element circuit. An example insulating layer 2 is oxide. The insulation layer 2 is electrically separated from an upper metal wiring layer. The insulation layer 2 also provides an even surface, as may be achieved through polishing. A photosensitive film (e.g., photoresist) is deposited on an upper surface of the insulation layer 2, and the photosensitive film is developed through a light exposure process using a mask on which there is formed a contact hole or via-hole pattern such that a photosensitive film pattern 3 are formed. The inner walls of the contact holes or via-holes of the photosensitive film pattern 3 are stepped. The inner walls narrow inwardly. The holes are wider at the top surface of film pattern 3 than at the upper surface of insulation layer 2. The different ways of forming the stepped photosensitive film pattern 3 will be described hereinafter.

When depositing the photosensitive film, the temperature is sequentially or continuously increased or decreased. In order to control the temperature, either a temperature of a sub-plate which supports a wafer is varied or a heater is affixed to the outside of a nozzle used for depositing the photosensitive film. If the temperature is varied, a sensitivity of the deposited photosensitive film is sequentially or continuously varied from a lower portion to an upper portion, thereby resulting in the stepped formation on the inner walls of the photosensitive film pattern 3.

As another method, when exposing the photosensitive film, the exposure energy is sequentially or continuously varied. The exposure energy is varied by controlling the energy of an exposure lamp first to a high level then slowly reducing the energy in the case of a positive photosensitive film, and in the case of a negative photosensitive film, energy control is performed in the opposite manner (i.e., from a low level to a high level). By varying the exposure energy, the sensitivity of the exposed photosensitive film is sequentially or continuously varied from a lower portion to an upper portion, thereby resulting in the stepped formation on the inner walls of the photosensitive film pattern 3.

As yet another method, when depositing the photosensitive film, a layered structure using photosensitive films of differing sensitivities is utilized. Photosensitive films of differing sensitivities are realized by adjusting a ratio of a PAC (photo active compound), which is the main component in a photosensitive film solution. In the case of a positive photosensitive film, photosensitive films of increasingly greater sensitivities are layered, whereas layering is performed in the opposite order in the case of a negative photosensitive film. Through this method of layering photosensitive films of differing sensitivities, the stepped formation on the inner walls of the photosensitive film pattern 3 is obtained during the developing process.

Figure 1B:
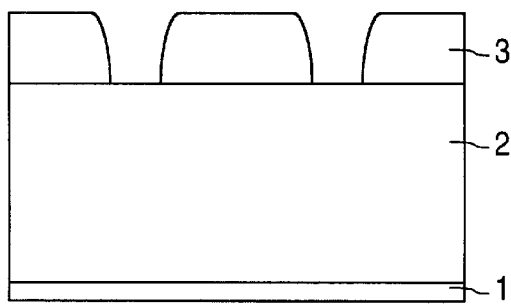

Referring to FIG. 1b, the photosensitive film pattern 3 fabricated in a stepped formation is then hard baked such that the stepped formation of the inner walls is smoothed. The holes are wider at the top surface of photosensitive layer 3 than at the top surface of insulation layer 2.

Figure 1C:
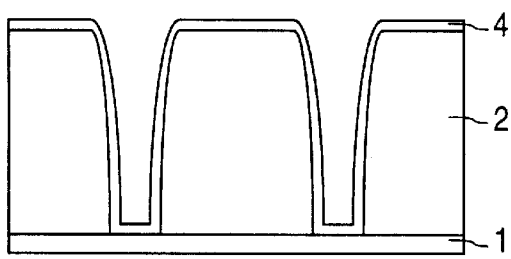

Next, referring to FIG. 1c, the exposed insulation layer 2 is dry-etched using the mask such that contact holes or via-holes are formed through insulation on layer 2 down to then film 1. Since the insulation layer 2 is etched following the contours of the photosensitive film pattern 3 of FIG. 1b, inner walls of the resulting contact holes or via-holes are smoothly curved downward toward the insulation layer 2. As a result, the step coverage problem does not occur. Following the formation of the contact holes or via-holes, the photosensitive film pattern is removed, and a barrier metal 4 is deposited over the entire surface of the insulation layer 2. Example barrier metals 4 are Ti and Ti/TiN.

Figure 1D:
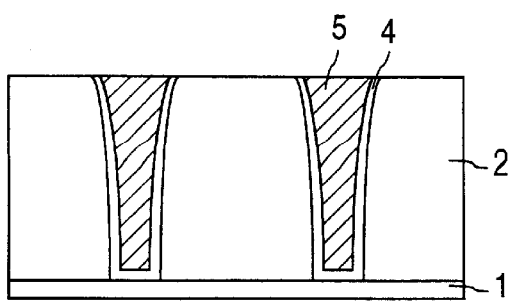

Subsequently, as shown in FIG. 1d, tungsten 5 is used to cover the barrier metal 4, with the contact holes or via-holes being filled with the tungsten 5. As a final step, a chemical mechanical polishing (CMP) process is used to remove the barrier metal 4 and tungsten 5 from the upper surface of the semiconductor element until the insulation layer 2 is exposed. A flat surface is realized by the process.

In the present invention as described above, with the etching of the insulation layer following the contours of the photosensitive film pattern, the inner walls of the resulting contact holes or via-holes are smoothly curved downward along an entire length thereof. Accordingly, the step coverage problem does not occur and an evenness of the semiconductor substrate is realized. Also, manufacturing costs are minimized because the argon sputter etch process of the prior art is not required. Finally, with the depositing of tungsten in the smoothly formed contact holes or via-holes, the generation of voids is prevented, thereby limiting the defective rate in the semiconductor manufacturing process.

To further elucidate the present invention, without limiting it, the following examples of methods of preparing the stepped inner walls of photosensitive film pattern 3 are provided. In the examples, "PR" is photoresist, and "CD" is critical dimension.

EXAMPLE 1

Coating at Different Temperatures with Photoresist

Figure 2:
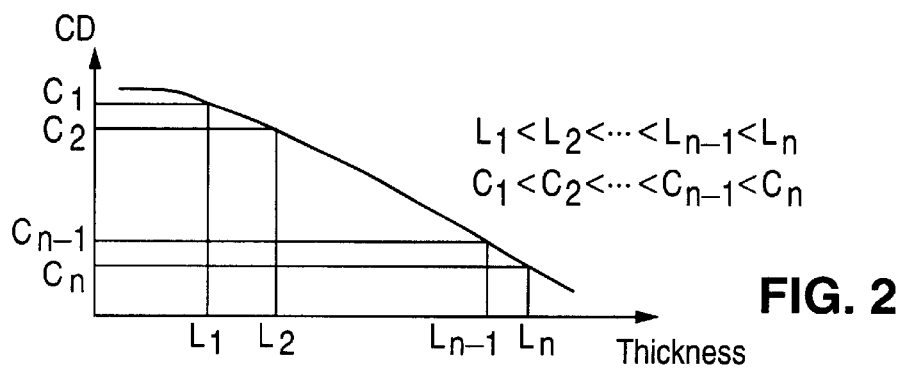
FIG. 2 is a graph showing critical dimension (CD) values as a function of photoresist thickness.
Figure 3:
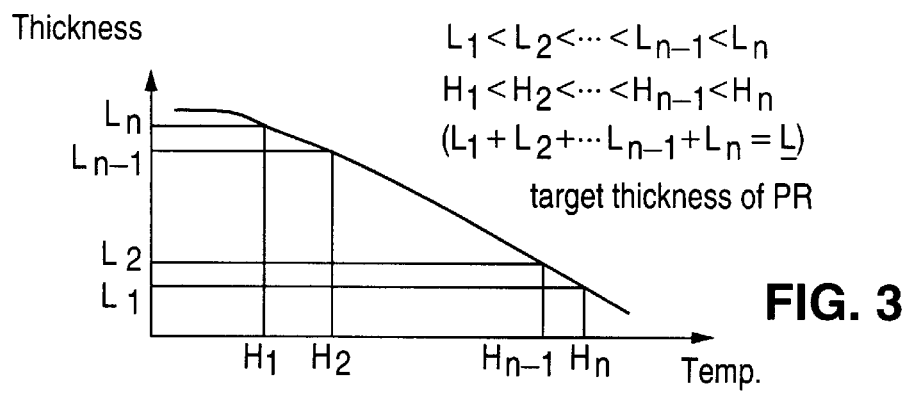
FIG. 3 is a graph showing thickness as a function f temperature.

Positive or negative photoresist may be used, as is respectively described below. Multiple layers of photoresist are used. In this example, three layers $L_1$, $L_2$, and $L_3$ are used, though the number of layers can vary. A goal is to have the same exposure conditions. The CD value at each layer is determined by PR thickness, as indicated in FIG. 2. The PR thickness depends on spin speed and components. A relationship between thickness and temperature is shown in FIG. 3. The target thickness L is the sum of the thicknesses of layers $L_1$, $L_2$, and $L_3$.

Figure 4:
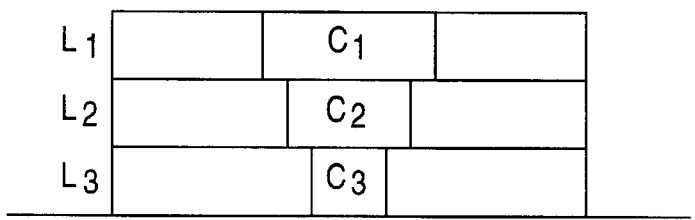
FIG. 4 is schematical illustration of three layers of positive photoresist.
Figure 5:
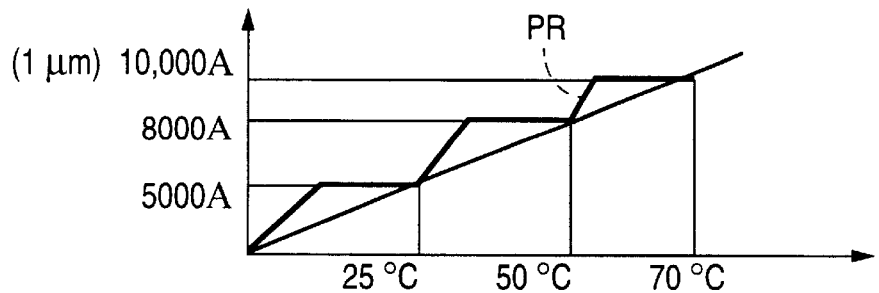
FIG. 5 is a graph of process where photoresist is applied at selected temperatures.

Layers of positive photoresist are shown in FIG. 4. Layer $L_3$ is on the oxide layer in this case. A exemplary process with parameter values is shown in FIG. 5. Layer $L_3$ has a thickness of 5000 Å. The temperature is 25° C. Layer $L_2$ has a thickness of 3000 Å. The temperature is 50 ° C. Layer $L_1$ has a thickness of 2000 Å. The temperature is 75° C. The temperature is ramped up continuously.

Figure 6:
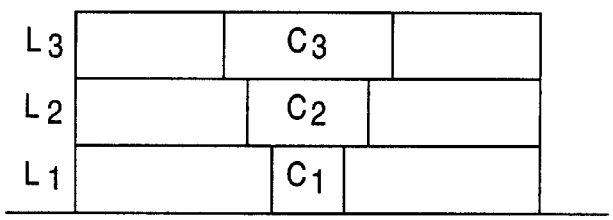
FIG. 6 is schematical illustration of three layers of negative photoresist.

Layers of negative photoresist are shown in FIG. 6. Layer $L_1$ is on the oxide layer in this case. Layer $L_1$ has a thickness of 2000 Å. The temperature is 70° C. Layer $L_2$ has a thickness of 3000 Å. The temperature is 50° C. Layer $L_3$ has a thickness of 2000 Å. The temperature is 25 ° C. The temperature is ramped down continuously. PR injection is in steps. A soft bake temperature is 60° C.

EXAMPLE 2

Exposing the Photosensitive Film With Different Exposure Energy

Figure 7:
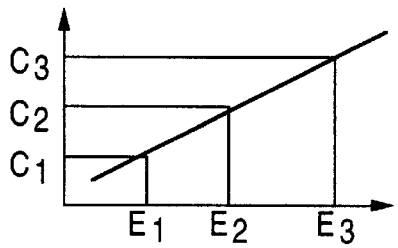
FIG. 7 is graph of a relationship between CD and exposure energy.
Figure 8:
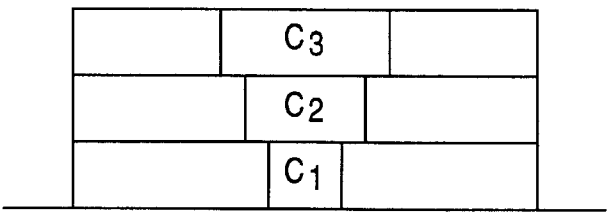
FIG. 8 is schematical illustration of the inner walls of the photosensitive film pattern.

Positive or negative photoresist may be used. The relationship between CD and exposure energy is shown in FIG. 7. The inner walls of the photosensitive film pattern are shown in FIG. 8. The energy is varied continuously. For positive photoresist, energy is reduced continuously in the direction from $E_n$ to $E_1$ of FIG. 7. The following values are exemplary.

| CD $\mu$m | Exposure Energy (mJ) |
|---|---|
| $C_1$ 0.35 | 40 |
| $C_2$ 0.40 | 45 |
| $C_3$ 0.45 | 50 |

For negative photoresist, the energy control is continuous in the opposite direction, i.e., from $E_1$ to $E_n$ in FIG. 7. Similar example values apply.

EXAMPLE 3

Coating Using Photoresist with Different Sensitivity

Figure 9:
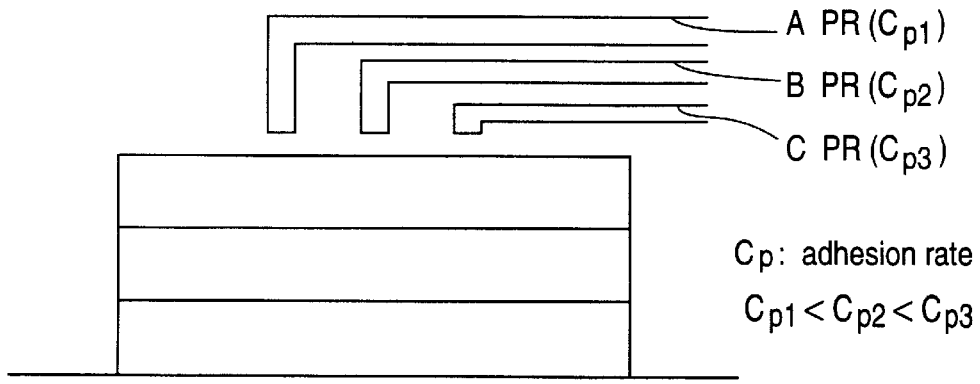
FIG. 9 is a schematical illustration of the application of three layers of photoresist having different sensitivities.
Figure 10:
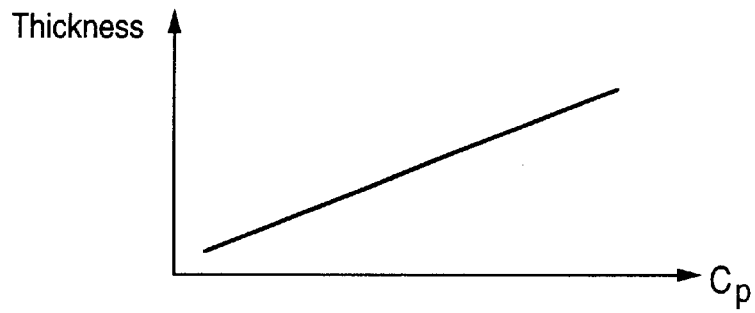
FIG. 10 is a graph of a relationship between thickness and adhesion rate.

Positive or negative photoresist may be used. PR thickness, t (Å), is effected according to the equation:

$$t = \frac{ks^2}{\sqrt{rpm}}$$

where rpm is spinner speed (rpm/1000), k is spin coat constant, and s is adhesion material percentage of the PR. FIG. 9 illustrates the application of three layers A, B, and C. FIG. 10 shows the relationship between thickness and adhesion rate $C_p$.

Figure 11:
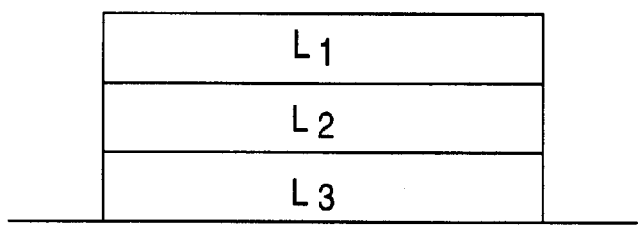
FIG. 11 is schematical illustration of three layers of positive photoresist.
Figure 12:
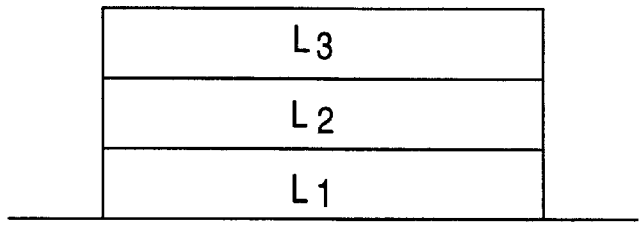
FIG. 12 is schematical illustration of three layers of negative photoresist.

For the case of positive photoresist, FIG. 11 shows an exemplary three layer stack where layer $L_3$ is thicker than layer $L_2$ which is thicker than $L_1$. For the case of a negative photoresist, FIG. 12 shows an exemplary three layer stack. Example values include:

| Thickness | Sensitivity |
|---|---|
| $L_1$ 4000 Å | $C_{p1}$: 6 |
| $L_2$ 6000 Å | $C_{p2}$: 11 |
| $L_3$ 10,000 Å | $C_{p3}$: 27 |

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming a portion of a semiconductor element on a wafer comprising the steps of:
   depositing an insulation layer on a lower thin film on which there is formed a semiconductor element electrode or a metal wiring pattern, and then planarizing an upper surface of the insulation layer;
   forming a photosensitive film pattern over the upper surface having a contact or via hole pattern in which inner walls of the contact holes or via holes smoothly curve downward to reach an upper surface of the insulation layer, by depositing a photosensitive film on an upper surface of the insulation layer and developing the photosensitive film through a light exposure process using a mask on which there is formed a contact hole or via-hole pattern, thereby forming the photosensitive film pattern in which inner walls of the photosensitive film pattern are in a stepped pattern, wherein in order to form the stepped pattern of the inner walls of the photosensitive film pattern, the temperature is continuously varied during the depositing of the photosensitive film, and then hard baking the photosensitive film pattern such that the stepped pattern of the inner wall is smoothed;
   dry-etching the insulation layer using the photosensitive film pattern as a mask to form contact holes or via holes;
   removing the photosensitive film pattern, then depositing a barrier metal and tungsten to fill the contact holes or the via holes; and
   performing a chemical mechanical polishing process to remove the barrier metal and the tungsten from the upper surface of the insulation layer until the upper surface of the insulation layer is exposed and a planar surface is obtained.

2. The method of claim 1 wherein the temperature is varied by altering a temperature of a sub-plate used to support the wafer.

3. The method of claim 1 wherein the temperature is varied using a heater affixed to the outside of a nozzle, the nozzle being used for depositing the photosensitive film.

4. A method for forming a portion of a semiconductor element on a wafer comprising the steps of:
   depositing an insulation layer on a lower thin film on which there is formed a semiconductor element electrode or a metal wiring pattern, and then planarizing an upper surface of the insulation layer;
   forming a photosensitive film pattern over the upper surface having a contact or via hole pattern in which inner walls of the contact holes or via holes smoothly curve downward to reach an upper surface of the insulation layer, by depositing a photosensitive film on an upper surface of the insulation layer and developing the photosensitive film through a light exposure process using a mask on which there is formed a contact hole or via-hole pattern, thereby forming the photosensitive film pattern in which inner walls of the photosensitive film pattern are in a stepped pattern, wherein in order to form the stepped pattern of the inner walls of the photosensitive film pattern, the exposure energy is sequentially or continuously varied, and then hard baking the photosensitive film pattern such that the stepped pattern of the inner wall is smoothed;

dry-etching the insulation layer using the photosensitive film pattern as a mask to form contact holes or via holes;

removing the photosensitive film pattern, then depositing a barrier metal and tungsten to fill the contact holes or the via holes; and performing a chemical mechanical polishing process to remove the barrier metal and the tungsten from the upper surface of the insulation layer until the upper surface of the insulation layer is exposed and a planar surface is obtained.

5. A method for forming a portion of a semiconductor device, the method comprising:

depositing a photosensitive polymeric film on a surface of a semiconductor wafer; and forming at least one hole in the polymeric film having stepped inner walls, wherein said forming includes irradiating selected portions of the polymeric film, wherein during said irradiating an exposure energy is continuously varied.

6. The method of claim 5, further comprising:

smoothing said stepped inner walls of the at least one hole; and etching the surface through the smoothed at least one hole.

7. A method for forming a portion of a semiconductor device, the method comprising:

depositing a photosensitive polymeric film on a surface of a semiconductor wafer; and forming at least one hole in the polymeric film having stepped inner walls, wherein said forming includes irradiating selected portions of the polymeric film, wherein during said irradiating an exposure energy is sequentially varied.

8. The method of claim 7, further comprising:

smoothing said stepped inner walls of the at least one hole; and etching the surface through the smoothed at least one hole.

9. A method for forming a portion of a semiconductor device, the method comprising:

applying a photosensitive polymeric material onto a surface of a semiconductor wafer, wherein during said applying a temperature of the polymeric material is continuously varied;

irradiating selected portions of the polymeric material on the semiconductor wafer, and subsequently removing portions of the polymeric material, so as to form at least one hole in the polymeric material with stepped inner walls.

10. The method of claim 9, further comprising:

smoothing said stepped inner walls of the at least one hole; and etching the surface through the smoothed at least one hole.

11. The method of claim 9, wherein the temperature of the polymeric material is varied by altering a temperature of the wafer.

12. The method of claim 9, wherein the temperature of the polymeric material is varied before the polymeric material is applied onto the wafer.

* * * * *